(12) United States Patent
Watanabe et al.

(10) Patent No.: US 7,786,564 B2
(45) Date of Patent: Aug. 31, 2010

(54) SEMICONDUCTOR DEVICE AND METHOD FOR MANUFACTURING SEMICONDUCTOR DEVICE

(75) Inventors: Mitsuhisa Watanabe, Tokyo (JP); Ichiro Anjoh, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/175,714

(22) Filed: Jul. 18, 2008

(65) Prior Publication Data

US 2009/0020874 A1      Jan. 22, 2009

(30) Foreign Application Priority Data

Jul. 18, 2007   (JP) ............................. 2007-186899

(51) Int. Cl.
*H01L 23/13* (2006.01)

(52) U.S. Cl. .................. 257/686; 257/666; 257/668; 257/672; 257/673; 257/676; 257/E23.004; 257/E23.026; 257/E23.043

(58) Field of Classification Search .................. 257/666, 257/668, 672–673, 676, E23.004, E23.026, 257/E23.043
See application file for complete search history.

(56) References Cited

U.S. PATENT DOCUMENTS

2005/0116353 A1 * 6/2005 Fujitani et al. ............... 257/778
2005/0236697 A1 * 10/2005 Katagiri et al. ............. 257/666

FOREIGN PATENT DOCUMENTS

| JP | 09-260536 | 10/1997 |
| JP | 11-163203 | 6/1999 |
| JP | 11-251493 | 9/1999 |
| JP | 2002-016197 | 1/2002 |
| JP | 2003-092377 | 3/2003 |
| WO | WO 99/23696 | 5/1999 |

* cited by examiner

*Primary Examiner*—Kiesha R Bryant
*Assistant Examiner*—Minchul Yang
(74) *Attorney, Agent, or Firm*—Young & Thompson

(57) ABSTRACT

A semiconductor device according to the present invention is provided with a semiconductor chip in which a plurality of electrode pads is provided on a principal surface, a plurality of bump electrodes provided on the electrode pads of the semiconductor chip, a square-shaped wiring board which is disposed on a side of the principal surface of the semiconductor chip, and in which at least two sides of an outer circumference that face each other are positioned in an area on the principal surface of the semiconductor chip, a plurality of external terminals which is provided on the wiring board, and which are electrically connected to a plurality of the bump electrodes through a wiring of the wiring board, and sealing material which is provided between the semiconductor chip and the wiring board, and which covers a connection part between the bump electrode and the wiring.

19 Claims, 7 Drawing Sheets

ND METHOD
SEMICONDUCTOR DEVICE AND METHOD FOR MANUFACTURING SEMICONDUCTOR DEVICE

BACKGROUND OF THE INVENTION

1. Field of the Invention

The present invention relates to a semiconductor device configured by mounting a wiring board on a semiconductor chip, and a method for manufacturing the semiconductor device.

2. Description of the Related Art

Japanese Patent Laid-Open No. 9-260536 discloses a semiconductor device with a configuration in which a flexible wiring board is disposed on a principal surface of a semiconductor chip using an intervening elastomer placed between the flexible wiring board and the semiconductor chip, and an electrode pad of the semiconductor chip, and a lead part of wiring disposed in an aperture part of the wiring board are electrically connected. An external terminal is provided in the other surface of the wiring board. Sealing material made of insulating resin covers an electrode pad of the semiconductor chip, which is disposed in the aperture part of the wiring board, and covers the lead part.

Such a semiconductor device is configured so that the electrode pad of the semiconductor chip and the lead part of the wiring board are electrically connected in the aperture part which is provided in the wiring board. Thus, the semiconductor device is configured so that the external terminal can not be disposed around just below the electrode pad of the semiconductor chip.

Year by year, an operation rate of the semiconductor device has been increased. In the semiconductor device, since the distance from the electrode pad of the semiconductor chip, for example, a wiring distance becomes longer, the operation speed may be lowered. Thus, for the semiconductor devices, there is a requirement shorten substantially the wiring distance to prevent the operation speed from being lowered, and to obtain favorable electrical characteristics.

As described above, since it is difficult to dispose the external terminal around just below the electrode pad of the semiconductor chip, the number of the external terminals may be also decreased which are disposed in an area of the wiring board on which a semiconductor chip is mounted. In the semiconductor device, there is such a trend that the number of the external terminals is increased, and it becomes necessary to dispose the external terminals outside of the area of the wiring board on which the semiconductor chip is mounted, so that an area of the wiring board may become larger. If the area of the wiring board becomes larger, a package size of the semiconductor device may become larger. This is a problem. In addition, if the area of the wiring board becomes larger, the number of the wiring boards that can be manufactured in one process is decreased during the wiring board manufacturing process, and the manufacturing cost of the wiring board may be increased. This is also a problem.

The above semiconductor device related to the present invention is configured so that the semiconductor chip is mounted on the wiring board using an intervening elastomer (elastic material) placed between the flexible wiring board and the semiconductor chip to improve the reliability when the semiconductor device is mounted on a printed wiring board such as a motherboard, so-called, in the case of the secondary mounting. By mounting the semiconductor chip on the wiring board using an intervening elastomer placed between the flexible wiring board and the semiconductor chip, it is possible to reduce stress because of a difference between the thermal expansion coefficients, and to improve the reliability in the case of the secondary mounting. However, since elastomer is relatively expensive material, the manufacturing cost of the semiconductor device may be increased.

In the semiconductor device related to the present invention, the semiconductor chip is mounted on the flexible wiring board by using the TAB (Tape Automated Bonding) method. Thus, in this semiconductor device, because of the influence caused by the size tolerance or the roll of sheet material configured in the wiring board, there exists such a problem in which the required mounting accuracy can not be obtained or a problem in which expensive mounting equipment may become necessary. Since the pitch of the electrode pad, the wiring and the like of the semiconductor device trends to be narrower, it becomes also necessary to improve mounting accuracy.

SUMMARY

The present invention seeks to solve one or more of above problems, or to improve upon those problems at least in part.

In one embodiment, there is provided a semiconductor device, comprising: a semiconductor chip in which a plurality of the electrode pads is provided on the principal surface, a plurality of bump electrodes which is provided on the electrode pads of the semiconductor chip, the square-shaped wiring board, which is disposed in a side of a principal surface of the semiconductor chip, and in which at least two sides of an outer circumference which face each other are positioned in an area on the principal surface of the semiconductor chip, a plurality of the external terminals which is provided on the wiring board, and which are electrically connected to a plurality of the bump electrodes through the wiring of the wiring board, and sealing material which is provided between the semiconductor chip and the wiring board, and which covers a connection part between the bump electrode and the wiring.

In another embodiment, there is provided a method for manufacturing the semiconductor device that includes a process for forming the bump electrodes on a plurality of the electrode pads formed on the principal surface of a semiconductor wafer, and a process for cutting the semiconductor wafer, in which the bump electrodes are formed, into individual semiconductor chips, and causing a jig to hold the separated semiconductor chip. In addition, the method for manufacturing the semiconductor device includes a process for mounting the wiring board on the semiconductor chip, by using the wiring board which includes a plurality of lands that corresponds to a plurality of the electrode pads respectively, and which includes the wiring for electrically connecting the electrode pad and the land, in which electrically connecting the bump electrode of the semiconductor chip maintained by the jig, and the wiring electrically connected to the land, so that at least two sides of the outer circumference of the wiring board which face each other are positioned in an area on the principal surface of the semiconductor chip.

According to the present invention, it is possible to downsize the whole device, and to reduce the manufacturing cost. According to the present invention, it is also possible to obtain favorable electrical characteristics, to reduce the stress applied to the semiconductor chip, and to improve the reliability.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purpose.

First Exemplary Embodiment

Figure 1:
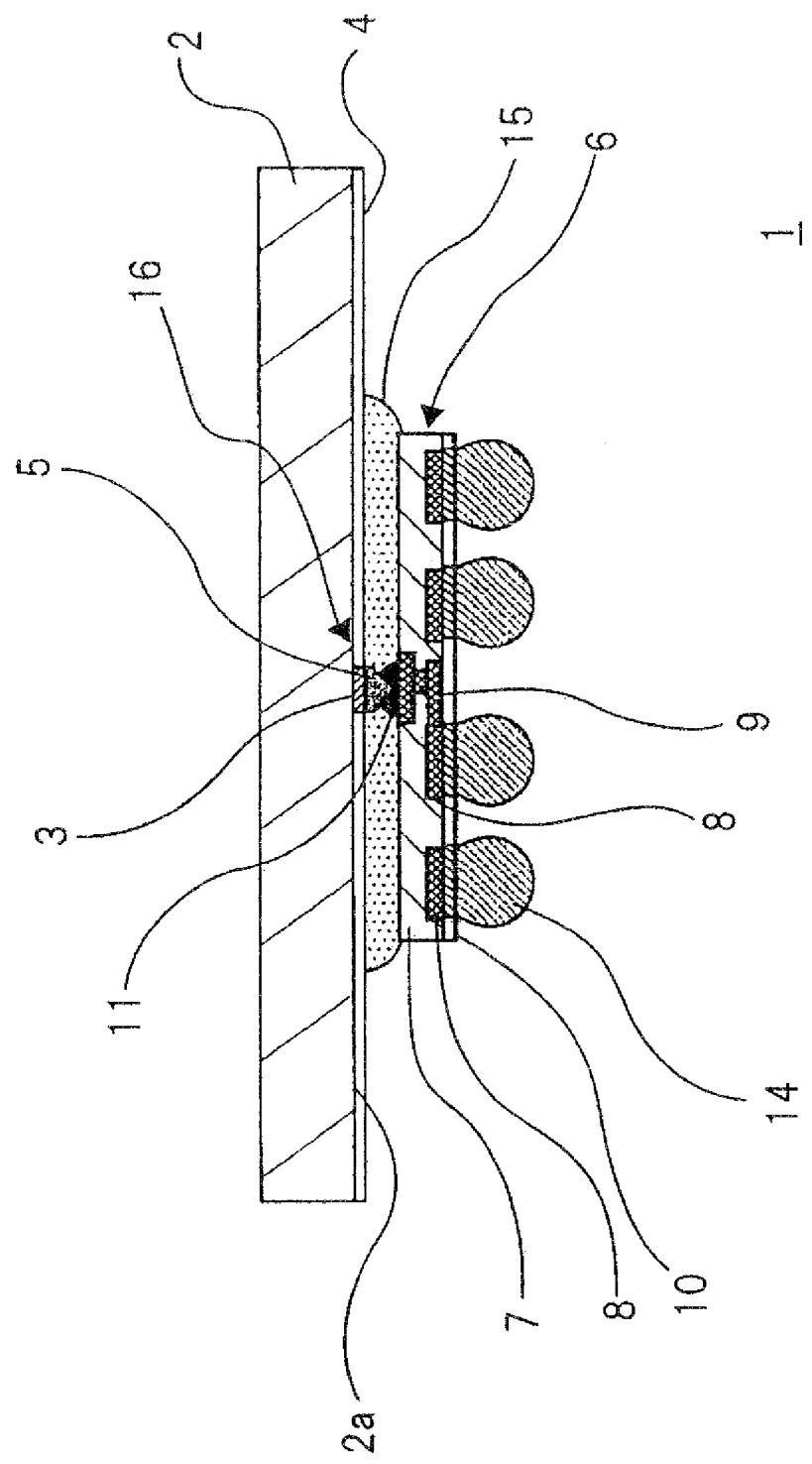
FIG. 1 is a cross-section diagram that illustrates a semiconductor device of a first exemplary embodiment.
Figure 2:
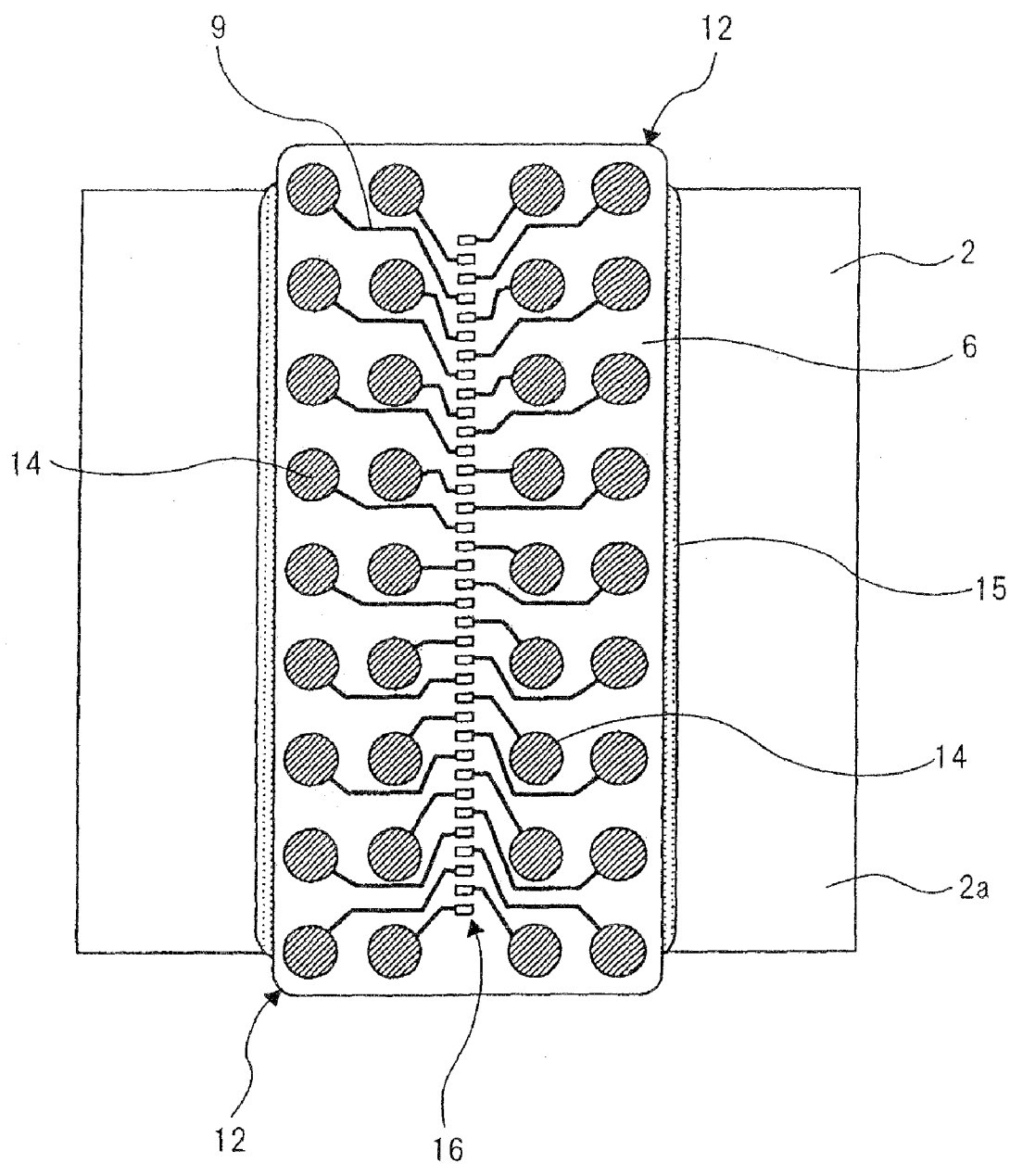
FIG. 2 is a plane diagram that illustrates the semiconductor device of the exemplary embodiment from a wiring board side.

FIG. 1 and FIG. 2 are diagrams illustrating a package structure of the semiconductor device of the first exemplary embodiment.

As illustrated in FIG. 1 and FIG. 2, semiconductor device 1 of the first exemplary embodiment is configured like a roughly-square plate, and includes semiconductor chip 2 in which a predetermined electronic circuit is formed on a principal surface. In the side of a principal surface 2a of semiconductor chip 2, a plurality of electrode pads 3 is, for example, disposed in a line along a centerline of one side of an outer circumference. As illustrated in FIG. 1, on principal surface 2a of semiconductor chip 2, insulating passivation layer 4 is formed at a position excluding electrode pad 3, and protects a circuit-formed surface of semiconductor chip 2. An electronic circuit (not illustrated) is formed in semiconductor chip 2, such as a logical circuit such as a microprocessor, and a memory circuit such as a SRAM (Static Random Access) and a DRAM (Dynamic Random Access Memory).

Bump electrode 5 for electrically connecting to wiring board 6 that will be mentioned later is formed on each of a plurality of electrode pads 3 formed on semiconductor chip 2. Bump electrode 5 is for example, formed by ultrasonic thermal compression-bonding a wire on electrode pad 3, in which a ball is formed at a melted tip, and breaking the wire.

Wiring board 6, which is formed so that the size of an area of wiring board 6 is smaller than that of semiconductor chip 2, is disposed in a side of principal surface 2a of semiconductor chip 2. In FIG. 2, in rectangle-shaped wiring board 6, two sides that face each other as the long side of the outer circumference are disposed in an area on principal surface 2a of semiconductor chip 2, and two sides the face each other as the short side of the outer circumference are disposed as extended from principal surface 2a of semiconductor chip 2 to the outside of an area on principal surface 2a. In wiring board 6, a length of the part extended from principal surface 2a of semiconductor chip 2 to the outside of the area on principal surface 2a can be appropriately selected according to a usage.

A flexible wiring board formed like a tape is used as wiring board 6. Wiring board 6, for example, includes tape base material 7 made of polyimide resin or the like, and a plurality of lands 8 for electrically connecting external terminal 14 that will be mentioned later are formed on tape base material 7. Wiring 9 is formed on base material 7, which electrically connects land 8 and bump electrode 5 formed on electrode pad 3 of semiconductor chip 2. Solder resist 10 is, for example, provided as insulating protection layer at a position excluding a connection part of land 8 and the like on a surface of base material 7.

As illustrated in FIG. 1, in wiring board 6, wiring 9 is electrically connected to bump electrode 5, for example, by conductive material 11 such as solder, and wiring board 6 is mounted on principal surface 2a of semiconductor chip 2 along a direction for arranging electrode pad 3 of semiconductor chip 2. As illustrated in FIG. 2, in the present exemplary embodiment, wiring board 6 is disposed on principal surface 2a of semiconductor chip 2 so that each side of the outer circumference of rectangle-shaped wiring board 6 is caused to be parallel to each side of the outer circumference of semiconductor chip 2, and electrode pad 3 of semiconductor chip 2 is positioned in a line on a centerline of the short side of wiring board 6. That is, wiring board 6 is disposed in a central area on principal surface 2a of semiconductor chip 2. Arc-shaped chamfer parts 12 are, for example, formed at four corners of the outer circumference of wiring board 6, and wiring board 6 is configured not to be easily peeled off from semiconductor chip 2.

Meanwhile, wiring board 6 may be disposed in an area other than the central area on principal surface 2a of semiconductor chip 2. However, even when warpage is induced in semiconductor chip 2 because of thermal stress or the like, the central area on principal surface 2a of semiconductor chip 2 is not easily influenced by the warpage. Thus, as described above, the reliability of semiconductor device 1 can be improved by allocating wiring board 6 in the central area on principal surface 2a of semiconductor chip 2.

A plurality of external terminals 14 for mounting semiconductor device 1 to a motherboard (main board) or the like is disposed on lands 8 provided on wiring board 6 so as to be positioned at the cross point of a grid. External terminal 14 is, for example, formed by mounting a ball made of solder or the like on land 8 through the flux, and reflowing the ball. External terminal 14 is, for example, formed with a diameter of around 0.35 mm, and is disposed in a pitch of around 0.5 mm, thereby, external terminal 14 can be efficiently disposed on wiring board 6. Thus, wiring board 6 can be configured, in which two sides of the outer circumference are disposed in the area on principal surface 2a of semiconductor chip 2, and the size of an area is relatively small. By disposing external terminals 14 together on wiring board 6 whose size of an area is relatively small, it is possible to shorten the wiring length on wiring board 6, and also to improve the electrical characteristics of semiconductor device 1.

Wiring board 6 may be a wiring board in which at least two sides of the outer circumference are disposed in an area on principal surface 2a of semiconductor chip 2, and at least one other side is disposed outside of an area on principal surface 2a of semiconductor chip 2. As in the present exemplary embodiment, in wiring board 6, since two sides of the outer circumferences that face each other are disposed in an area on principal surface 2a of semiconductor chip 2, and other two sides are disposed outside of the area on principal surface 2a of semiconductor chip 2, thus the size of an area of wiring board 6 can be caused to be small. Therefore, the number of wiring boards 6 to be manufactured can be increased, external terminals 14 can be also disposed outside of the area on principal surface 2a of semiconductor chip 2, and the required number of external terminals 14 can be disposed regardless of the size of semiconductor chip 2.

Underfill material is provided as insulating sealing material 15 between semiconductor chip 2 and wiring board 6. Sealing material 15 may be configured so as to cover at least connection part (connection pad) 16 between bump electrode 5 and wiring 9. In the present exemplary embodiment, to mount tape-like wiring board 6 on principal surface 2a of semiconductor chip 2 without bending, sealing material 15 is provided in the whole area between semiconductor chip 2 and wiring board 6.

As described above, semiconductor device 1 of the present exemplary embodiment, comprising: semiconductor chip 2 in which a plurality of electrode pads 3 is provided on principal surface 2a, a plurality of bump electrodes 5 provided on electrode pads 3 of semiconductor chip 2, wiring board 6 which is disposed in the side of principal surface 2a of semiconductor chip 2, and in which at least two sides of the outer circumference, that face each other, are disposed in the area on principal surface 2a of semiconductor chip 2, a plurality of external terminals 14 which is provided on wiring board 6, and are electrically connected to a plurality of bump electrodes 5 through wiring 9 of wiring board 6, and sealing material which is provided between semiconductor chip 2 and wiring board 6, and covers at least the connection part between bump electrode 5 and wiring 9. In such a configuration, semiconductor device 1, which is downsized to a so-called real chip size which is almost equal to a size of semiconductor chip 2 can be realized.

In semiconductor device 1, the area of wiring board 6 becomes smaller, and a large number of wiring boards 6 to be manufactured in one process can be secured, so that the manufacturing cost of semiconductor device 1 can be reduced. Since at least two sides of the outer circumference of wiring board 6 that face each other are disposed in the area on principal surface 2a of semiconductor chip 2, the stress applied to semiconductor chip 2 can be reduced. Since at least one other side of the outer circumference of wiring board 6 is disposed outside of the area on principal surface 2a of semiconductor chip 2, external terminal 14 can be also disposed outside of the area on principal surface 2a of semiconductor chip 2. Thus, the required number of external terminals 14 can be disposed on wiring board 6, whose area is relatively small, regardless of the size of semiconductor chip 2.

Since the area of wiring board 6 is small, it becomes easy to pour sealing material 15 between semiconductor chip 2 and wiring board 6. Since the area of wiring board 6 becomes small, the area on which the part is to be mounted to the motherboard can also be decreased. Since the wiring length on wiring board 6 can be shortened, the electrical characteristics can also be improved.

Meanwhile, a square-shaped wiring board (not illustrated) may be configured so that four sides of the outer circumference are disposed in an area on a principal surface of the semiconductor chip.

Figure 3:
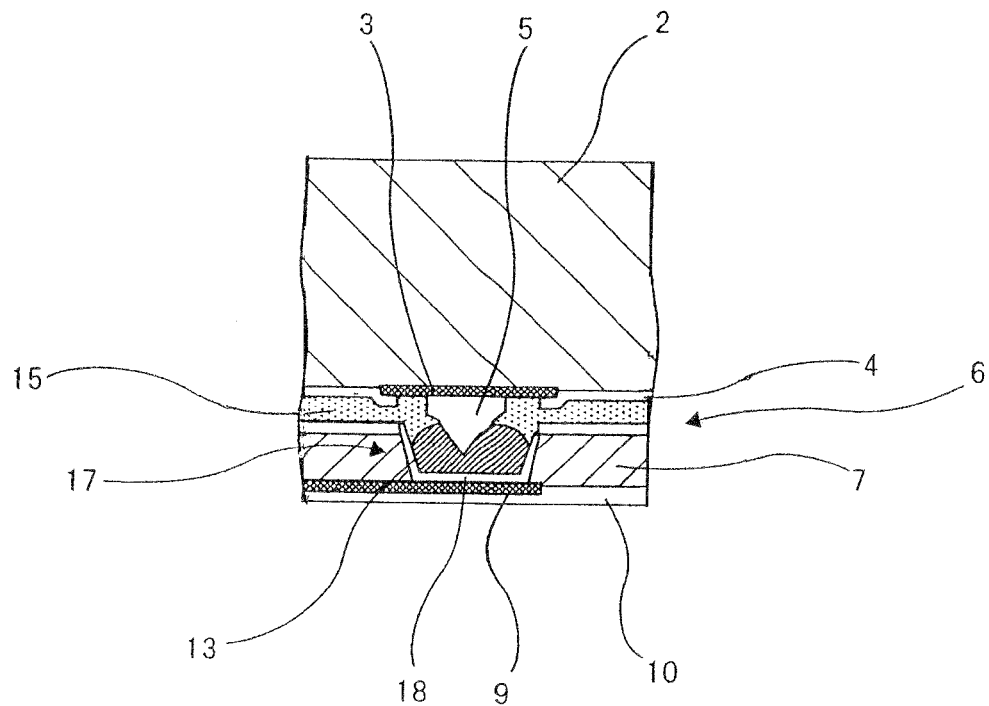
FIG. 3 is a cross-section diagram that illustrates another exemplary configuration of the semiconductor device of the exemplary embodiment.

FIG. 3 is a diagram illustrating another exemplary configuration of a connection structure between bump electrode 5 of semiconductor chip 2 and wiring board 6. Recess 17 is provided at a position which corresponds to each of bump electrodes 5 of wiring board 6. Recess 17 may be large to the extent that bump electrode 5 can be disposed. A surface layer wiring, which is positioned in the side of external terminal 14 of wiring board 6, is disposed in recess 17. Bump electrode 5 is electrically connected to the surface layer wiring, which is positioned in the side of external terminal 14 of wiring board 6, through conductive adhesive material 13. In such a configuration, it is possible to improve the electrical characteristics, and to make semiconductor device 1 thinner.

Plating 18 made from Cu/Ni/Au is, for example, formed in the surface layer wiring in recess 17, and it is possible to secure, by using plating 18, a favorable electrical connection between semiconductor chip 2 and wiring board 6. Since recess 17 is formed in the electrical connection part, it is possible to secure a large adhesive area between semiconductor chip 2 and wiring board 6.

Figure 4:
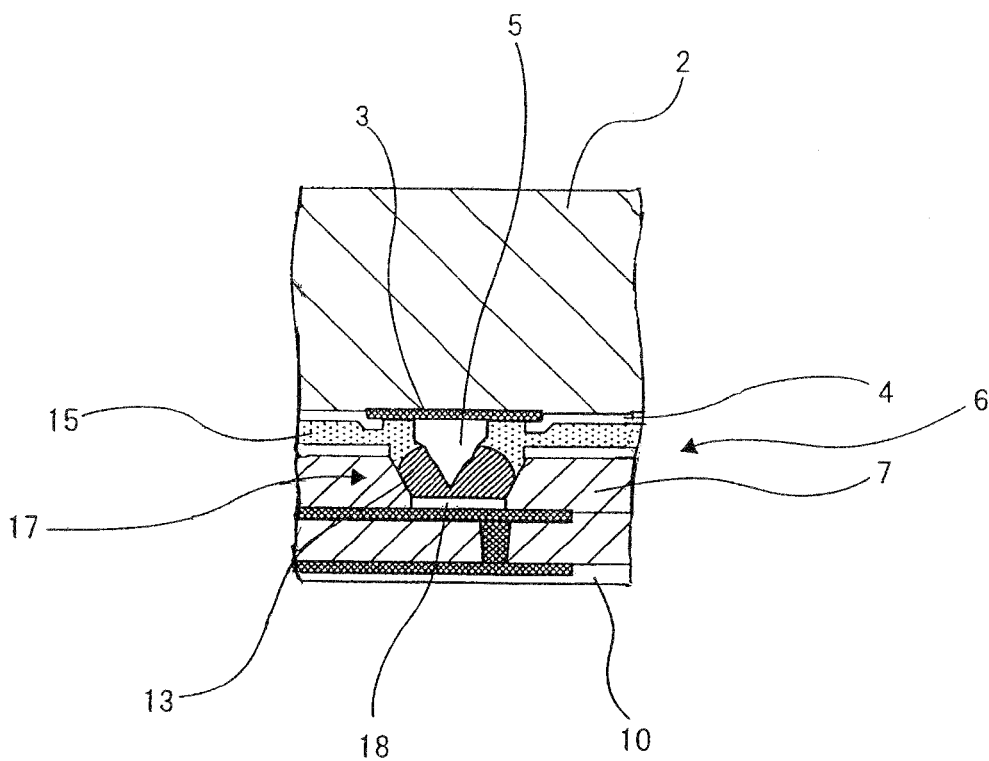
FIG. 4 is a cross-section diagram that illustrates further another exemplary configuration of the semiconductor device of the exemplary embodiment.

FIG. 4 is a cross-section diagram illustrating further another exemplary configuration of the connection structure when a multilayer wiring board is used as wiring board 6. As illustrated in FIG. 4, in semiconductor device 1, it becomes possible to prevent wiring board 6 from becoming thicker by using the multilayer wiring board, and to create higher density wiring.

Figure 5:
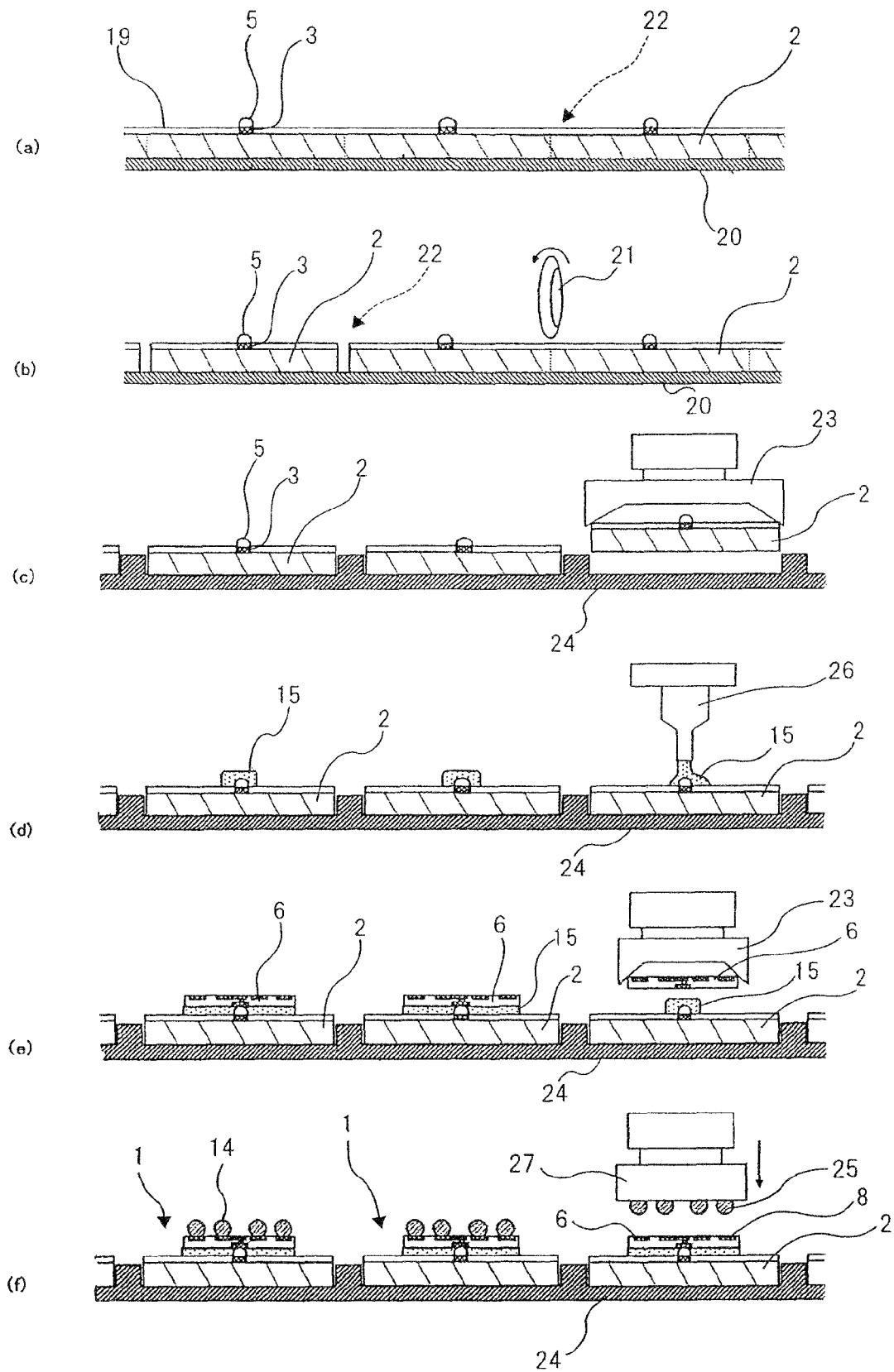
FIG. 5 is a cross-section diagram that illustrates a manufacturing process of the semiconductor device of the exemplary embodiment.

Next referring to FIG. 5, a method for manufacturing semiconductor device 1 of the first exemplary embodiment will be described.

First, a disk-like silicon substrate, which is, for example, obtained by slicing a silicon ingot formed by a single crystal pulling method or the like, is used as a semiconductor wafer in the method for manufacturing semiconductor device 1. The semiconductor wafer is provided, in which desired circuits and electrode pads are formed through a diffusion process and the like, on one principal surface of the silicon substrate.

As illustrated in FIG. 5(A), while semiconductor wafer 19 is being placed and fixed on adhesive UV (Ultraviolet) tape 20, bump electrode 5 is formed on each electrode pad 3. Bump electrode 5 is, for example, formed by ultrasonic thermal compression-bonding a wire on electrode pad 3, in which a ball is formed at a melted tip, and breaking the compression-bonded wire.

Next, while being fixed on UV tape 20, semiconductor wafer 19 is moved to a dicing operation. As illustrated in FIG. 5(B), semiconductor wafer 19 is cut and separated into each semiconductor chip 2 by using high rate-rotating dicing blade 21 in rotation-grinding dicing area 22 provided between each semiconductor chip 2. After semiconductor wafer 19 is cut into each semiconductor chip 2, UV light is radiated on UV tape 20, and the adhesive force of UV tape 20 is weakened. While the adhesive force of UV tape 20 is weak, semiconductor chip 2 is pushed up from a lower side with a pushing up material (not illustrated), and semiconductor chip 2 is peeled off from UV tape 20, thereby, semiconductor chip 2 is picked up. Thus, semiconductor chip 2 is obtained in which bump electrode 5 is formed on electrode pad 3.

Next, as illustrated in FIG. 5(C), semiconductor chip 2, in which a plurality of bump electrodes 5 is formed, is transferred by absorbing collet 23 or the like, and is stored and held in a holding part of carrier jig 24. While semiconductor chip 2 is being held by carrier jig 24, the following process is executed.

As illustrated in FIG. 5(D), in semiconductor chip 2 held by carrier jig 24, underfill material is, for example, selectively applied as insulating sealing material 15 on electrode pad 3 by potting apparatus 26. Meanwhile, after wiring board 6 is mounted on semiconductor chip 2, sealing material 15 may be poured in space between wiring board 6 and semiconductor chip 2. Thereby, since the connection part between bump electrode 5 and wiring board 6, and the space between semiconductor chip 2 and wiring board 6 are covered with sealing material 15, it is possible to protect the connection part and to mount wiring board 6 without bending.

As described above, wiring board 6, whose area is relatively small but sufficient large so that at least two sides of the outer circumference can be disposed in the area on principal surface 2a of semiconductor chip 2, has been previously provided.

In wiring board 6, a plurality of lands 8 is formed, and wiring 9, which is electrically connected land 8 with bump electrode 5 formed on electrode pad 3 of semiconductor chip 2, which has been previously formed.

Conductive material 11 or adhesive material 13 has been previously applied to connection part (connection pad) 16 of wiring board 6 to bump electrode 5.

As illustrated in FIG. 5(E), while wiring board 6 is being absorbed and held by absorbing collet 23 or the like, electrode pad 3 of semiconductor chip 2 and connection part (connection pad) 16 of wiring board 6 are aligned, and connection part (connection pad) 16 of wiring board 6 and bump electrode 5 are electrically connected through conductive material 11, thereby, wiring board 6 is mounted on principal surface 2a of semiconductor chip 2. In this case, since wiring board 6 is mounted on semiconductor chip 2, sealing material 15 is expanded through the space between semiconductor chip 2 and wiring board 6, and wiring board 6 is held and fixed by sealing material 15.

A heating mechanism is provided in absorbing collet 23 for mounting wiring board 6, and wiring board 6 is transferred and is heated by absorbing collet 23, thereby, wiring board 6 may be efficiently mounted.

As illustrated in FIG. 5(F), semiconductor chip 2 on which wiring board 6 is mounted is moved to a ball-mounting process, conductive ball 25 is mounted on land 8 of wiring board 6 respectively, and a plurality of external terminals 14 is made from ball 25. In the ball-mounting process, ball 25 made of solder or the like is, for example, held at a absorbing hole by a mounting tool, in which a plurality of the absorbing holes is formed as adjusting to the allocation of land 8 on wiring board 6. And the flux is transcription-formed on held ball 25, and balls 25 are mounted together on lands 8 on wiring board 6. After ball 25 is mounted, ball 25 is fixed by reflowing ball 25. Thereby, so-called real chip size semiconductor device 1, whose size is almost equal to a size of semiconductor chip 2, is obtained.

As described above, since semiconductor device 1 is manufactured by using wiring board 6, whose area is relatively small but sufficiently large so that at least two sides of the outer circumference can be disposed in the area on principal surface 2a of semiconductor chip 2, a large number of wiring boards 6 to be manufactured in one process can be secured, so that the manufacturing cost of semiconductor device 1 can be reduced.

In semiconductor device 1 of the present exemplary embodiment, before sealing material such as sealing material 15 is applied, dicing is executed. Thus, it is possible to prevent a dicing blade from being worn away due to filler included in the sealing material and the like, and to prevent the dicing blade from being consumed.

Since wiring boards 6 is configured for being mounted on semiconductor chip 2 held by carrier jig 24, wiring boards 6 can be mounted so that at least two sides of the outer circumference are disposed in the area on principal surface 2a of semiconductor chip 2, and the other one side of the outer circumference is extended from principal surface 2a of semiconductor chip 2 to the outside of the area on principal surface 2a. Since the influence, which is caused by the bending of wiring boards 6, is small, wiring boards 6 can be mounted with high accuracy.

Second Exemplary Embodiment

Figure 6:
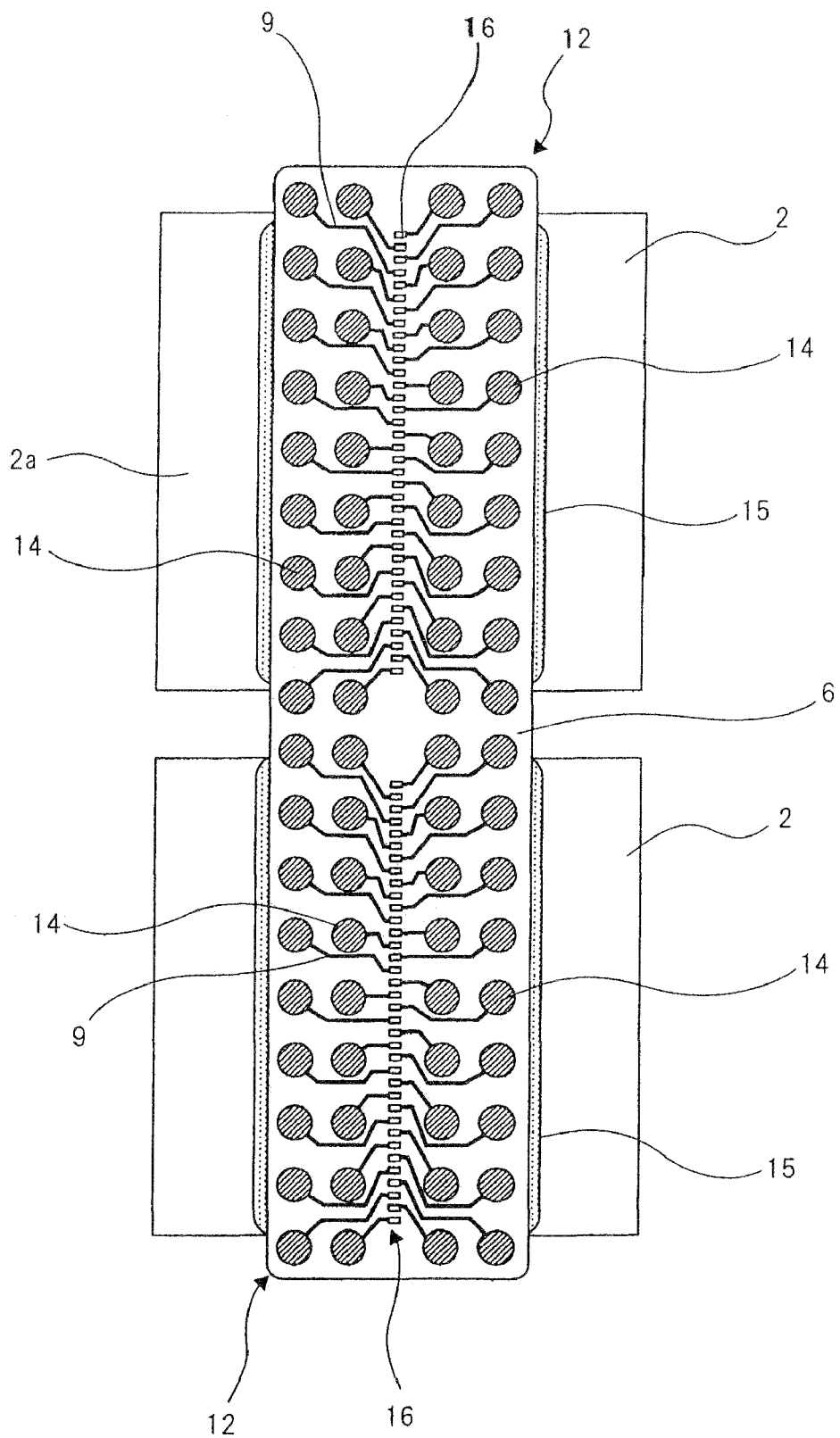
FIG. 6 is a plane diagram that illustrates the semiconductor device of a second exemplary embodiment from the wiring board side.

FIG. 6 is a plane diagram illustrating a package structure of the semiconductor device of the second exemplary embodiment.

Semiconductor device 1 of the second exemplary embodiment is configured like semiconductor device 1 of the first exemplary embodiment, and is different from semiconductor device 1 of the first exemplary embodiment in that other electronic parts, for example, other semiconductor chip 2 is mounted on an edge area of wiring board 6, which is extended from principal surface 2a of semiconductor chip 2 to the area that is outside of principal surface 2a. In other words, in the present exemplary embodiment, wiring board 6 is mounted as straddling principal surfaces 2a of two semiconductor chips 2. As described above, since the electronic parts is mounted on the edge area of wiring board 6, which is extended from principal surface 2a of semiconductor chip 2 to the outside of the area on principal surface 2a, it is possible to improve the function of semiconductor device 1, and to realize semiconductor device 1 having high-level functions and a large-capacity such as MCP (Multi Chip Package) and SiP (System In Package).

Even in semiconductor device 1 of the second exemplary embodiment, since wiring board 6 is mounted on each semiconductor chip 2, in which at least two sides of the outer circumference are disposed in the area on principal surface 2a of semiconductor chip 2, and whose area is relatively small, the same advantageous effect as that of the first exemplary embodiment can be obtained. In the configuration illustrated in FIG. 6, the same semiconductor chips 2 are mounted as electronic parts on the edge area of wiring board 6, which is extended from principal surface 2a of semiconductor chip 2 to the area that is outside of principal surface 2a. Semiconductor device 1 of the second exemplary embodiment is not limited to such a configuration, and exemplary embodiment may be configured so that semiconductor chips whose functions are different from each other, a packaged semiconductor device such as the BGA (Ball Grid Array), or a passive element such as a chip condenser is mounted on wiring board 6. Semiconductor device 1 of the second exemplary embodiment may be configured so that a plurality of electronic parts is electrically connected by the wiring in the wiring board.

Third Exemplary Embodiment

Figure 7:
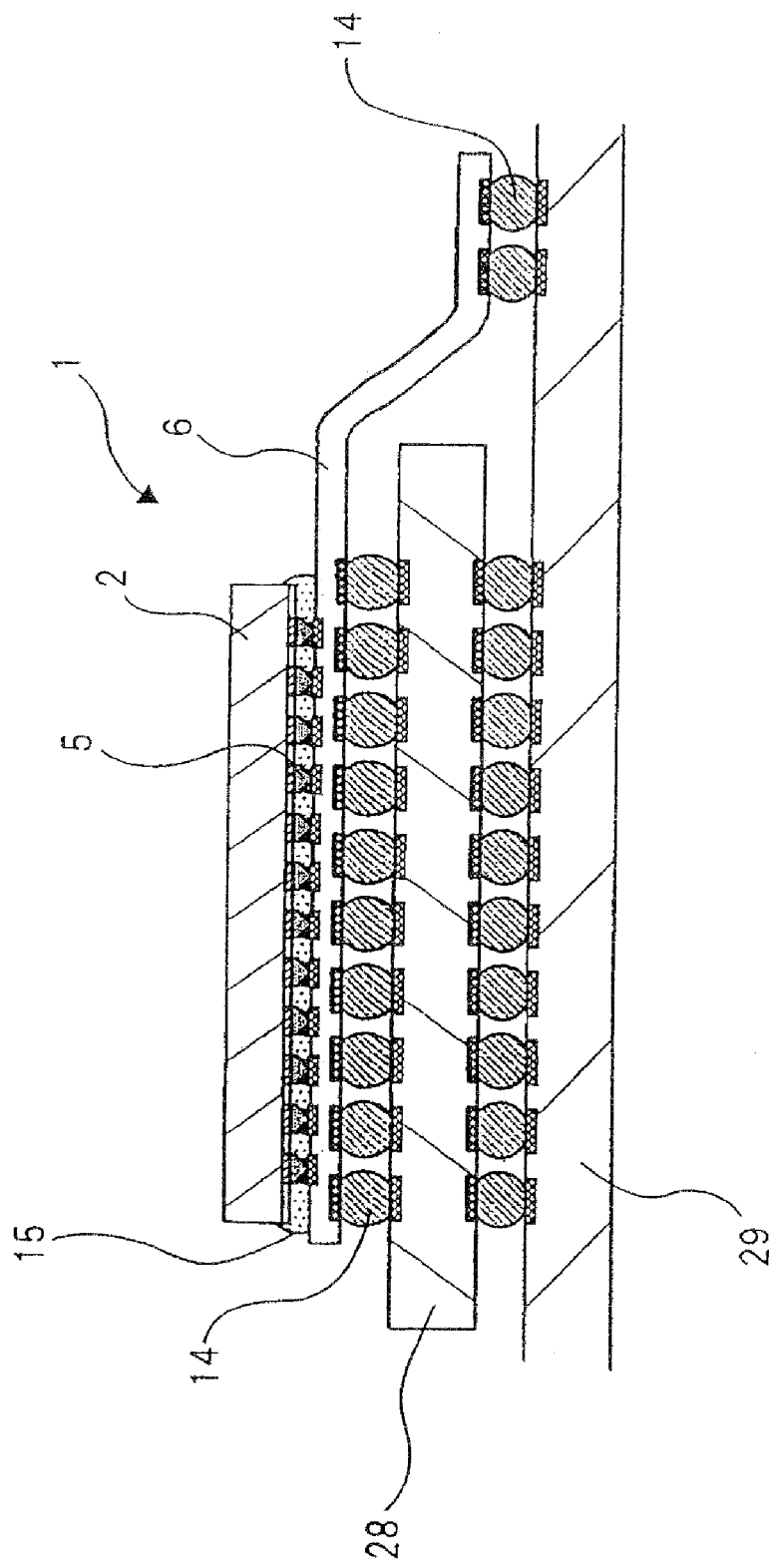
FIG. 7 is a cross-section diagram that illustrates the semiconductor device of a third exemplary embodiment.

FIG. 7 is a diagram illustrating a package structure of the semiconductor device which is a third exemplary embodiment.

Semiconductor device 1 of the third exemplary embodiment is configured like semiconductor device 1 of the first exemplary embodiment, and is different from semiconductor device 1 of the first exemplary embodiment in that an external terminal is mounted on the edge area of wiring board 6, which is extended from principal surface 2a of semiconductor chip 2 to the outside of the area on principal surface 2a.

In the configuration illustrated in FIG. 7, semiconductor device 1 configured like that of the first exemplary embodiment is mounted on motherboard 29 using daughter board (sub-board) 28. Meanwhile, daughter board 28 denotes, for example, an intermediate board disposed between semiconductor device 1 and motherboard 29 such as a wiring board for a memory module, and a wiring board for the MCP.

As illustrated in FIG. 7, a plurality of external terminals 14 is mounted on the edge area of wiring board 6, which is extended from principal surface 2a of semiconductor chip 2 to the outside of the area on principal surface 2a. A plurality of external terminals 14 provided on the edge area of wiring board 6 can be directly connected to the wiring of motherboard 29 without daughter board 28. According to the present exemplary embodiment, the number of external terminals 14 can be increased regardless of the size of semiconductor chip 2.

Fourth Exemplary Embodiment

Figure 8:
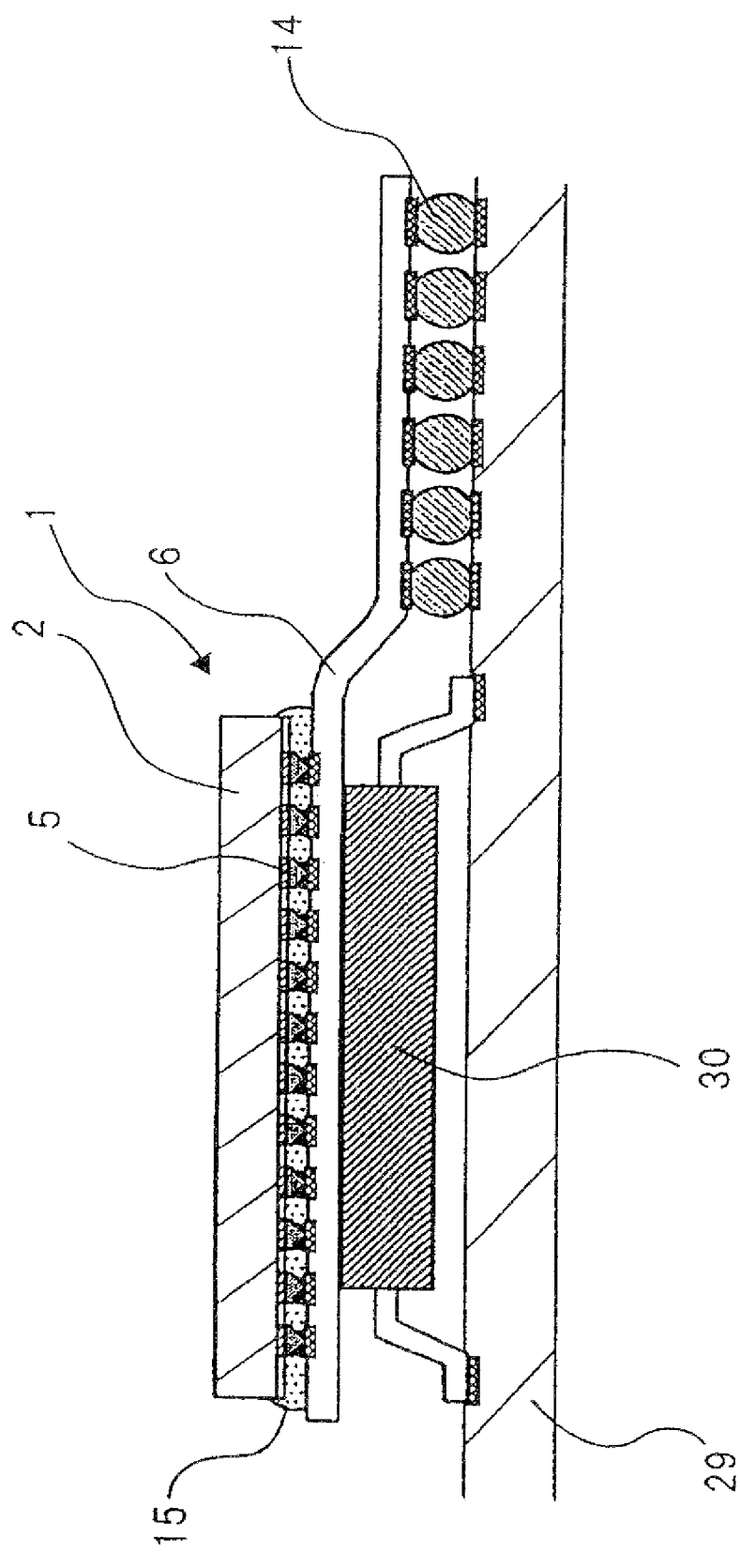
FIG. 8 is a cross-section diagram that illustrates the semiconductor device of a fourth exemplary embodiment.

FIG. 8 is a diagram illustrating a package structure of the semiconductor device of a fourth exemplary embodiment.

Semiconductor device 1 of the fourth exemplary embodiment is configured like semiconductor device 1 of the first exemplary embodiment, and is different from semiconductor device 1 of the first exemplary embodiment in that all external terminals 14 are mounted only on the edge area of wiring board 6, which is extended from principal surface 2a of semiconductor chip 2 to the outside of the area on principal surface 2a. As described above, since all external terminals 14 are mounted only on the edge area of wiring board 6, which is extended from principal surface 2a of semiconductor chip 2 to the area that is outside of principal surface 2a, a part, which corresponds to principal surface 2a of semiconductor chip 2, in wiring board 6, that is, a part, which supports semiconductor chip 2, in wiring board 6 is disposed on the upper side of electronic parts 30 mounted on motherboard 29, and semiconductor device 1 of the present exemplary embodiment can be mounted on motherboard 29 with external terminals 14 which are disposed on the area that is outside principal surface 2a of semiconductor chip 2 on wiring board 6. In such a configuration, since semiconductor chip 2 and electronic parts 30 are stacked and disposed, it is possible to reduce the size of the area on motherboard 29 where semiconductor device 1 is to be mounted, and to contribute to downsizing an electronic apparatus in which motherboard 29 is incorporated.

Meanwhile, the present invention is not limited to each of the above exemplary embodiments, and a variety of changes can be applied without departing from the concept of the present invention. While such a configuration has been described in the present exemplary embodiment in which tape-like wiring board 6 is used, for example, a rigid board such as a glass epoxy board may also be used.

While such a case has been described in the present exemplary embodiment in which wiring board 6 is electronically connected to semiconductor chip 2 by using the flip chip method, at least two sides of the outer circumference may be configured so that the wiring board, whose area is smaller than that on the principal surface of the semiconductor chip, is electronically connected by using the wire-bonding method.

Although the inventions have been described above in connection with several preferred embodiments thereof, it will be appreciated by those skilled in the art that those embodiment are provided solely for illustrating the invention, and should not be relied upon to construe the appended claims in limiting sense.

What is claimed is:

1. A semiconductor device, comprising:
   a semiconductor chip in which a plurality of electrode pads is provided on a principal surface;
   a plurality of bump electrodes which is provided on the electrode pads of the semiconductor chip;
   a square-shaped wiring board which is disposed on a principal surface side of the semiconductor chip, and in which at least two sides of an outer circumference which face each other are positioned in an area of the principal surface of the semiconductor chip;
   a plurality of external terminals which is provided on the wiring board, and which are electrically connected to a plurality of the bump electrodes through a wiring of the wiring board; and
   sealing material which is provided between the semiconductor chip and the wiring board, and which covers a connection part between the bump electrode and the wiring,
   wherein at least one side of the outer circumference of the wiring board is extended from the principal surface of the semiconductor chip to the area that is outside the principal surface.

2. The semiconductor device according to claim 1, wherein the external terminal is disposed to the area that is outside the principal surface.

3. The semiconductor device according to claim 1, wherein another electronic part is disposed to the area that is outside the principal surface.

4. The semiconductor device according to claim 1, wherein the external terminal is disposed only in the area that is outside the principal surface.

5. The semiconductor device according to claim 1, wherein a plurality of the electrode pads is disposed along a centerline of one side of the semiconductor chip.

6. The semiconductor device according to claim 1, wherein a plurality of the electrode pads is disposed on a straight line, and two sides of the wiring board which face each other, which are parallel to the electrode pads arranged in a straight line, are disposed in an area on the principal surface of the semiconductor chip.

7. The semiconductor device according to claim 1, wherein a chamfer part is formed at a part that is at the corner part of the outer circumference of the wiring board.

8. The semiconductor device according to claim 1, wherein the wiring board is a flexible wiring board.

9. The semiconductor device according to claim 1, wherein, in the wiring board, a recess is provided at a position corresponding to the bump electrode, and is electrically connected to a surface layer wiring of a side of the external terminal.

10. The semiconductor device according to claim 9, wherein the sealing material extends into the recess.

11. The semiconductor device according to claim 1, further comprising a plating layer formed on the surface layer wiring within the recess.

12. A semiconductor device, comprising:
    a semiconductor chip having a plurality of electrode pads provided on a principal surface of the semiconductor chip;

a plurality of bump electrodes provided on the electrode pads of the semiconductor chip;

a square-shaped wiring board disposed on a principal surface side of the semiconductor chip;

a plurality of external terminals provided on the wiring board, each electrically connected to a plurality of the bump electrodes through a wiring of the wiring board; and sealing material provided between the semiconductor chip and the wiring board covering a connection part between the bump electrode and the wiring, wherein a recess is provided into a surface of the wiring board at a position corresponding to the bump electrode and is electrically connected to a surface layer wiring of a side of the external terminal.

13. The semiconductor device according to claim 12, further comprising a plating layer formed on the surface layer wiring within the recess.

14. The semiconductor device according to claim 12, wherein at least two sides of an outer circumference of the wiring board and semiconductor chip which face each other are positioned in an area of the principal surface of the semiconductor chip.

15. The semiconductor device according to claim 12, wherein the external terminal is disposed to the area that is outside the principal surface.

16. The semiconductor device according to claim 12, wherein a plurality of the electrode pads is disposed along a centerline of one side of the semiconductor chip.

17. The semiconductor device according to claim 12, wherein the sealing material extends into the recess.

18. A semiconductor device, comprising:

a semiconductor chip having a plurality of electrode pads provided on a principal surface of the semiconductor chip;

a plurality of bump electrodes provided on the electrode pads of the semiconductor chip;

a primary wiring board having a first side disposed on a principal surface side of the semiconductor chip and a second side disposed adjacent to an intermediate wiring board;

a plurality of external terminals provided on the first and second sides of the primary wiring board, each electrically connected to a plurality of the bump electrodes through a wiring of the primary wiring board; and sealing material provided between the semiconductor chip and the first side of the primary wiring board covering a connection part between the bump electrode and the wiring, wherein the intermediate wiring board extends past circumferential edges of the semiconductor chip, and the primary wiring board extends past circumferential edges of the intermediate wiring board.

19. The semiconductor device according to claim 18, wherein the plurality of external terminals on the second side of the primary wiring board extend past one of the circumferential edges of the semiconductor chip.

* * * * *